United States Patent [19]
Lee

[11] Patent Number: 6,121,125
[45] Date of Patent: Sep. 19, 2000

[54] METHOD OF FORMING POLYCIDE GATE

[75] Inventor: Tzung-Han Lee, Taipei, Taiwan

[73] Assignee: United Microelectronics Corp., Hsinchu, Taiwan

[21] Appl. No.: 09/186,125

[22] Filed: Nov. 4, 1998

[51] Int. Cl.$^7$ ............................................... H01L 21/4763
[52] U.S. Cl. ..................... 438/592; 438/595; 438/303; 438/655; 438/683
[58] Field of Search ..................... 438/592, 655, 438/683, 299, 303–307, 591–596, 585–588

[56] References Cited

U.S. PATENT DOCUMENTS

| | | | |
|---|---|---|---|
| 5,600,165 | 2/1997 | Tsukamoto et al. | 257/323 |
| 5,679,591 | 10/1997 | Lin et al. | 437/323 |
| 5,851,927 | 12/1998 | Cox et al. | 438/744 |
| 5,924,000 | 7/1999 | Linliu | 438/592 |

*Primary Examiner*—Tuan H. Nguyen
*Assistant Examiner*—Thanh Nguyen
*Attorney, Agent, or Firm*—Thomas, Kayden, Horstemeyer & Risley

[57] ABSTRACT

A method of forming a polycide gate is provided. On a substrate having a gate oxide layer thereon, a polysilicon layer and a silicide layer are formed. A multi-insulation layer and a hard material layer are formed on the silicide layer. The multi-insulation layer comprises multiple insulation layers. The thermal expansion coefficients of these insulation layers are between the thermal expansion coefficients of the silicide layer and the hard material layer, and moreover, are closer to it of the hard material layer gradually layer by layer. The hard mask layer, multi-insulation layer, silicide layer and the polysilicon layer are then defined to form a polycide gate. A spacer is formed to cover a side wall of the gate.

12 Claims, 2 Drawing Sheets

METHOD OF FORMING POLYCIDE GATE

BACKGROUND OF THE INVENTION

1. Field of the Invention

The invention relates in general to a method of forming a polycide gate, and more particularly, to a method of preventing the silicide layer to peel from the polycide gate.

2. Description of the Related Art

In the semiconductor fabrication process, the polycide gate formed of lightly doped polysilicon and tungsten silicide is commonly used for commercial. In FIG. 1, the cross setion view of a conventional polycide gate is shown. A gate oxide layer 102, a polysilicon layer 104 and a tungsten silicide layer 106 are formed on a substrate 100. Through photolithography and etching process, the polycide gate 108 is formed. A spacer 110 is formed on a side wall of the polycide gate 108. In the subsequent process, a dielectric layer 112 with on opening 114 exposing a part of the substrate 100 is formed over the substrate 100. The opening 114 is filled with conductive material to electrically connect with the substrate. As the dimension of semiconductor is developed to a line width of 0.25 μm, the size of the opening 114 is concomitantly shrunk. As a consequently, being restricted by the resolution of the exposure stepper, the opening 114 cannot afford to be shrunk unlimitedly. Therefore, the fabrication process for forming the opening 114 as shown in FIG. 1 does not meet the requirements of the fabrication line.

A method of self-aligned contact (SAC) is developed for solving the problem of the fabrication process mentioned above. In FIG. 2, a gate oxide layer 202, a polysilicon layer 204, and a tungsten silicide layer 206 are formed on a substrate 200. A silicon nitride layer 208 is formed on the tungsten silicide layer 206. Using photolithography and etching process, a gate 210 is formed. A spacer 212 is formed on a side wall of the gate 210 and the silicon nitride layer 208. Similar to the above process, a dielectric layer 214 with an opening 216 exposing the spacer 212, a part of the substrate 200 and the silicon nitride layer 208 is formed over the substrate 200.

The formation of the spacer 212 and the silicon nitride layer 208 are functioned as a hard mask layer for the tungsten silicide layer 206 as well as the polycide gate 210. A larger selectivity of the dielectric layer to the silicon nitride layer 214 is chosen for the etching process of forming the opening 216. The etchant used for the etching process etches the dielectric layer 214 along the profile of the silicon nitride layer 208 and the spacer 212 to form the opening 216. Thus, the formation of the opening 216 is formed without the restriction of the resolution of the exposure stepper. The silicon nitride layer 208 is used as an etch stop layer for forming the opening 216. However, due to the different mechanical properties such as the different thermal expansion coefficient between the silicon nitride layer 208 and the tungsten silicide layer 206, the silicon nitride layer 208 is easy to peel from the tungsten silicide layer 206.

Moreover, to improve the conductivity of the tungsten silicide layer 206, the mass ratio of the tungsten to silicon (W/Si) has to be increased. The more the tungsten proportion is increased, the more the stress is between the tungsten silicide layer 206 and the silicon nitride layer 208 to cause the silicon nitride layer 208 to peel.

SUMMARY OF THE INVENTION

It is an object of the invention to provide a method to release the stress between the silicon nitride layer and the silicide layer without decreasing the conductivity of the silicide layer. Therefore, the problem of silicon nitride to peel from the silicide layer is improved.

To achieve the above-mentioned objects and advantages, a method of forming a polycide gate is provided. On a substrate having a gate oxide layer thereon, a polysilicon layer and a silicide layer are formed. A multi-insulation layer and a hard material layer are formed on the silicide layer. The multi-insulation layer comprises multiple insulation layers. The thermal expansion coefficients of these insulation layers are between the thermal expansion coefficients of the silicide layer and the hard material layer, and moreover, are closer to it of the hard material layer gradually layer by layer. The hard mask layer, multi-insulation layer, silicide layer and the polysilicon layer are then defined to form a polycide gate. A spacer is formed to cover a side wall of the gate.

Both the foregoing general description and the following detailed description are exemplary and explanatory only and are not restrictive of the invention, as claimed.

DESCRIPTION OF THE PREFERRED EMBODIMENTS

Figure 3A:
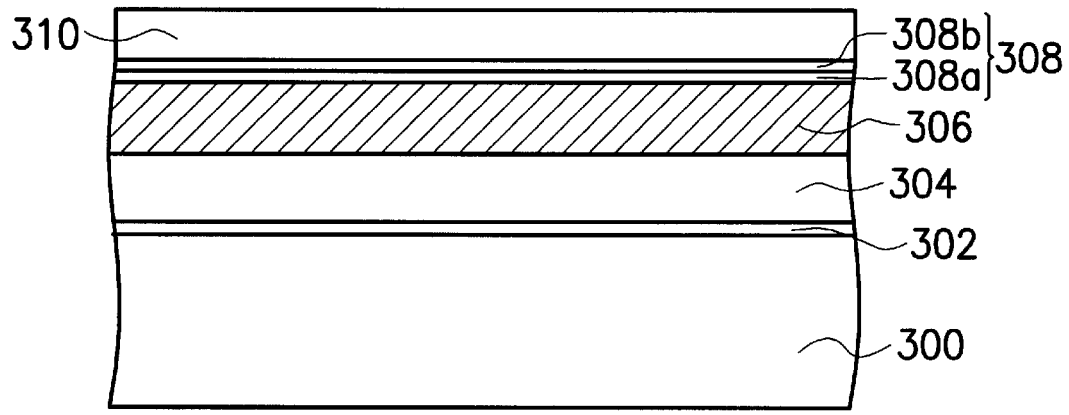
FIG. 3A to FIG. 3C shows cross sectional views of forming a polycide gate.
Figure 3B:
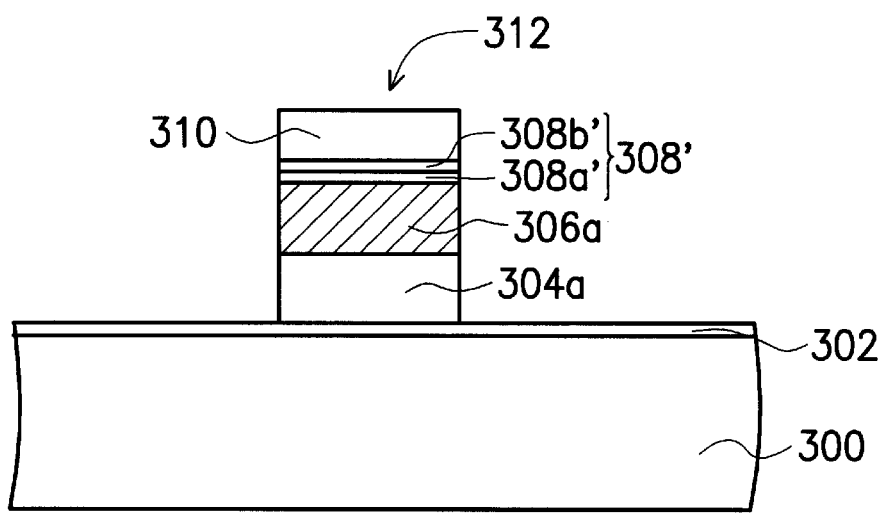

In FIG. 3A, a gate oxide layer 302 is formed on a substrate 300. A polysilicon layer 304 is formed on the gate oxide layer 302. Preferably, the polysilicon layer 304 is formed by low pressure chemical vapor deposition (LPCVD) to decompose tetrachloro-methane ($SiH_4$) at a temperature of about 600 to 650° C. under a pressure of about 0.3 torr to 0.6 torr. The reaction speed of deposition is controlled by the partial pressure of $SiH_4$.

A silicide layer 304 is formed on the polysilicon layer 304. The very common material tungsten silicide is preferably used. Tungsten hexafluoride is used as the gas source of the tungsten. At an environment of silane at about 300° C. to 400° C. under a pressure, the silicide layer 306 is formed on the polysilicon layer 304.

Figure 1:
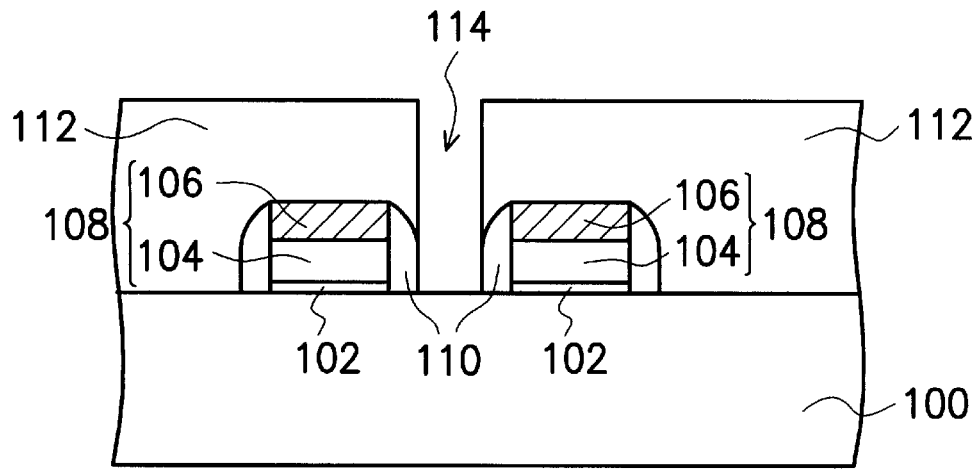
FIG. 1 shows a conventional polycide gate.
Figure 2:
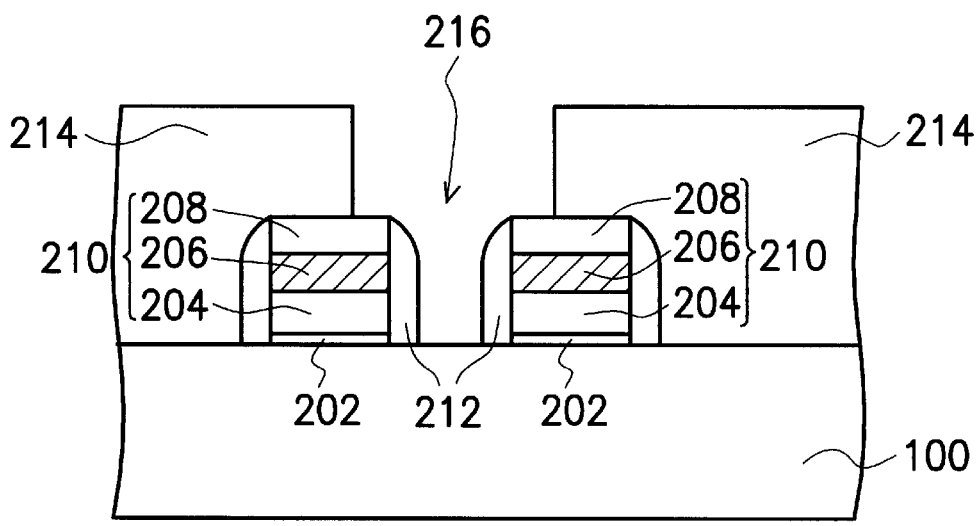
FIG. 2 shows another conventional polycide gate.
Figure 4:
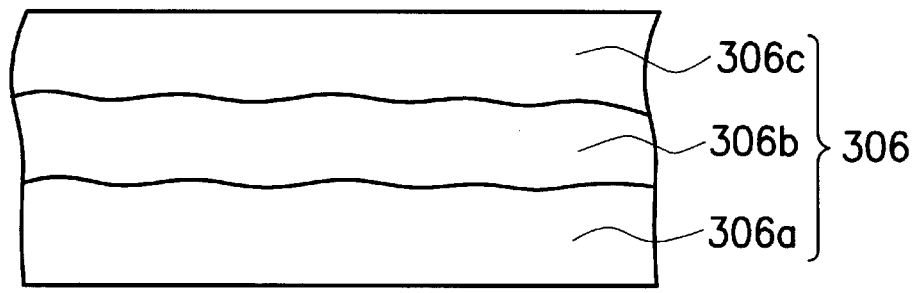
FIG. 4 shows a cross section of the polycide gate formed by the method shown in FIG. 3A to FIG. 3C.

In the invention, the silicide layer 306 further comprises a first silicide layer 306a, a second silicide layer 306b, and a third silicide layer 306c as shown in FIG. 4. The first and the third silicide layers 306a and 306c are silicon rich silicide, whereas, the second silicide is formed by metal rich silicide. For example, while a tungsten rich silicon tungsten layer is used as the second silicide layer 306b, the first and the third silicide layers are formed from silicon rich tungsten silicide. That is, the mass proportion of metal to silicon in the first and the third silicide layers is less than it in the second silicide layer.

In FIG. 3A, a multi-insulation layer 308 is formed on the silicide layer 306. The multi-insulation layer comprising two of more than two insulation sub-layers stacked together. A hard material layer 310 is formed on the multi-insulation layer 308. The thermal expansion coefficient of the multi-insulation layer 308 is between the thermal expansion coefficients of the silicide layer 306 and the hard material layer 310. Moreover, the insulation sub-layer closest to the silicide layer 306 has a thermal expansion coefficient closest to it of the silicide layer 306, while the insulation sub-layer closest to the hard material layer 310 has a thermal expansion coefficient closest to it of the hard mask layer 310. The multi-insulation layer 308 is thus formed with a gradually decreasing difference in thermal expansion coefficient to the hard material layer 310. On the other hand, the multi-insulation layer 308 is thus formed with a gradually increasing difference in thermal expansion coefficient to the silicide layer 306.

The insulation sub-layers of the multi-insulation layer 308 comprise at least a first insulation layer 308a and a second insulation layer 308b. Very commonly, the hard material layer 310 is formed from silicon nitride by low pressure chemical vapor deposition (LPCVD) or plasma enhanced CVD (PECVD). To avoid the multi-insulation layer 308 to peel from the silicide layer 306 and the hard material layer 310 to peel from the multi-insulation layer 308, the first insulation layer 308a is selected from a material with a thermal expansion coefficient close to it of the silicide layer 306. Preferably, a silicon oxide layer is used as the first insulation layer 308a. Similarly, a silicon oxy-nitride layer (SiON) is selected as the second insulation layer 308b. As a consequence, the problem of peeling effect between layers in the prior technique is solved.

Using photolithography and etching process, the hard material layer 310, the multi-insulation layer 308, the silicide layer 306, and the polysilicon layer 304 are defined for forming a polycide gate 312.

Figure 3C:
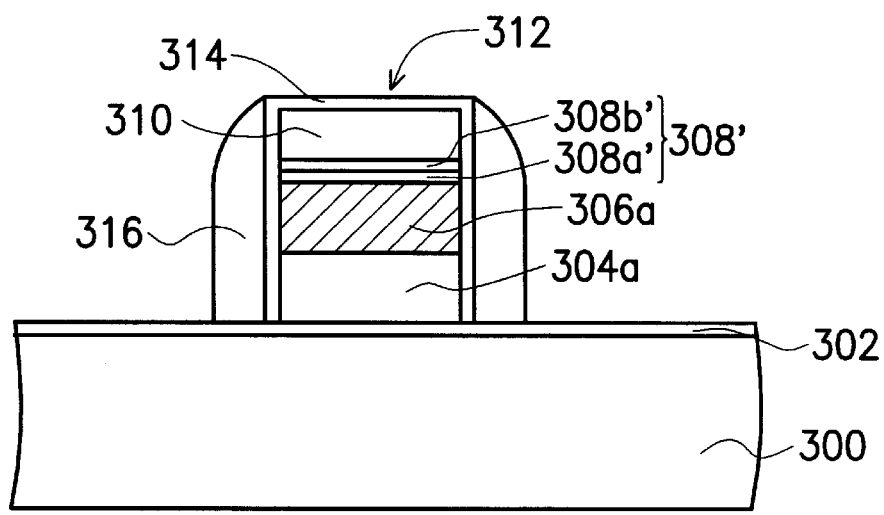

In FIG. 3C, a thin and conformal dielectric layer 314 is formed, for example, by thermal oxidation or deposition, to cover gate 312 and to protect the side wall of the silicide layer. An insulation layer is formed and etched over the substrate 300 to form a spacer 316a on a side wall of the gate 312. A typical material to form the spacer 316a is silicon nitride.

In the invention, the peeling effect between different layers due to stress caused by thermal expansion coefficient difference is prevented by forming a multi-layer structure which has a gradual increasing or decreasing thermal expansion coefficient. Thus, the reliability of products is enhanced. Furthermore, with the formation of the thin and conformal dielectric layer, the side wall of the silicide layer is protected from being damaged during the subsequent process, so that the reliability of products is further enhanced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a polycide gate on a gate oxide layer on a substrate, comprising:

forming a polysilicon layer and a silicide layer;

forming a multi-insulation layer comprising at least two insulation sub-layers on the silicide layer, the insulation sub-layers having different thermal expansion coefficients, wherein a first insulation layer of the multi-insulation layer has a thermal expansion coefficient closer to a thermal expansion coefficient of the silicide layer compared to a second insulation layer of the multi-insulation layer;

forming a material layer on the multi-insulation layer;

patterning the material layers, the multi-insulation layer, the silicide layer and the polysilicon layer to form a gate;

forming a thin dielectric layer conformal to the gate; and forming a spacer on a side wall of the gate.

2. The method according to claim 1, wherein the silicide layer comprises a tungsten silicide layer.

3. The method according to claim 1, wherein the silicide layer further comprises a first silicide layer, a second silicide layer, and a third silicide layer.

4. The method according to claim 3, wherein the first and the third silicide layers each has a weight proportion of metal to silicon larger than a weight proportion of metal to silicon in the second silicide layer.

5. The method according to claim 1, wherein the multi-insulation layers comprises at least a first insulation sub-layer formed on the silicide layer with a thermal expansion coefficient close to the silicide layer, and a second insulation sub-layer formed on the first insulation sub-layer with a thermal expansion coefficient close to the material layer.

6. The method according to claim 5, wherein the material layer includes a silicon nitride layer.

7. The method according to claim 6, wherein the first sub-insulation layer includes a silicon oxide layer.

8. The method according to claim 7, wherein the second sub-insulation layer includes a silicon oxy-nitride layer.

9. The method according to claim 1, wherein the material layer includes a silicon nitride layer.

10. The method according to claim 9, wherein the first sub-insulation layer includes a silicon oxide layer.

11. The method according to claim 10, wherein the second sub-insulation layer includes a silicon oxy-nitride layer.

12. A method of forming a polycide gate on a gate oxide layer on a substrate, comprising:

forming a polysilicon layer and a silicide layer;

forming an insulation layer on the silicide layer;

forming a material layer on the insulation layer;

patterning the material layer, the insulation layer, the silicide layer and the polysilicon layer to form a gate;

forming a thin dielectric layer conformal to the gate; and forming a spacer on a side wall of the gate; wherein the insulation layer is formed layer by layer with a gradually increasing difference in thermal expansion coefficient to the silicide layer and a gradually decreasing difference in thermal expansion coefficient to the material layer.

* * * * *